United States Patent
Chen et al.

(10) Patent No.: US 11,799,296 B2
(45) Date of Patent: Oct. 24, 2023

(54) ISLANDING DETECTION SYSTEM AND METHOD

(71) Applicant: Delta Electronics (Shanghai) Co., Ltd., Shanghai (CN)

(72) Inventors: Shen Chen, Shanghai (CN); Feidong Xu, Shanghai (CN); Xuancai Zhu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 186 days.

(21) Appl. No.: 17/453,866

(22) Filed: Nov. 8, 2021

(65) Prior Publication Data

US 2022/0190604 A1 Jun. 16, 2022

(30) Foreign Application Priority Data

Dec. 10, 2020 (CN) .......................... 202011456343.0

(51) Int. Cl.
*H02J 3/38* (2006.01)
*G01R 19/25* (2006.01)

(52) U.S. Cl.
CPC .......... *H02J 3/381* (2013.01); *G01R 19/2513* (2013.01); *H02J 3/388* (2020.01); *H02J 2300/24* (2020.01)

(58) Field of Classification Search
CPC ........ H02J 3/381; H02J 3/388; H02J 2300/24; H02J 2203/20; G01R 19/2513; G01R 31/00; G01R 19/00
See application file for complete search history.

(56) References Cited

U.S. PATENT DOCUMENTS

| 11,029,345 | B2 * | 6/2021 | Ohori | H02J 3/1842 |
| 2014/0225442 | A1 * | 8/2014 | Sato | H02J 3/466 |
| | | | | 307/69 |
| 2015/0028851 | A1 * | 1/2015 | Ohori | H02J 3/1842 |
| | | | | 324/76.82 |
| 2019/0195923 | A1 * | 6/2019 | Ohori | H02J 3/381 |

FOREIGN PATENT DOCUMENTS

| CN | 102890216 A | 1/2013 |
| CN | 105656054 B | 5/2018 |
| CN | 109861278 A | 6/2019 |
| CN | 110361617 A | 10/2019 |

* cited by examiner

*Primary Examiner* — Jared Fureman
*Assistant Examiner* — Michael J Warmflash
(74) *Attorney, Agent, or Firm* — CKC & Partners Co., LLC

(57) ABSTRACT

An islanding detection system and method for multiple inverters operating in parallel, wherein the multiple inverters at least comprises a first inverter and a second inverter connected in parallel. The islanding detection system comprises a current detection circuit arranged on a grid side or an AC side of the second inverter; and a controller connected to the current detection circuit and the first inverter. The controller determines whether to perform distributed islanding detection or centralized islanding detection on the first inverter and the second inverter according to a grid voltage signal and a current detection signal of the current detection circuit. By recognizing the islanding detection mode of the second inverter, matching it with typical islanding detection modes preset in a library, and determining to perform a distributed or centralized islanding detection according to matching results, the application improves the success ratio of islanding detection.

23 Claims, 6 Drawing Sheets

ISLANDING DETECTION SYSTEM AND METHOD

CROSS-REFERENCE TO RELATED APPLICATIONS

This non-provisional application claims priority under 35 U.S.C. § 119(a) on Patent Application No. 202011456343.0 filed in P.R. China on Dec. 10, 2020, the entire contents of which are hereby incorporated by reference.

Some references, if any, which may include patents, patent applications, and various publications, may be cited and discussed in the description of this application. The citation and/or discussion of such references, if any, is provided merely to clarify the description of the present application and is not an admission that any such reference is "prior art" to the application described herein. All references listed, cited, and/or discussed in this specification are incorporated herein by reference in their entireties and to the same extent as if each reference was individually incorporated by reference.

BACKGROUND OF THE INVENTION

1. Field of the Invention

The application relates to islanding detection, and particularly to an islanding detection system and method for multiple inverters operating in parallel.

2. Related Art

In a new energy power generation system, inverter is often used to convert DC electric energy into AC electric energy, and output of the inverter is connected to a load and a grid through a breaker. When the grid is disconnected due to a fault or other reasons, the inverter and the local load will operate in an islanding state. Since the islanding state will threaten overhaul and maintenance, it shall be detected and terminated in some conditions. Conventionally, detection of the islanding operation state (short for "islanding detection") comprises active islanding detection and passive islanding detection. The passive islanding detection is realized by monitoring parameters such as voltage and frequency at PCC point. However, since the passive islanding detection always has a large non-detection zone (NDZ), the active islanding detection shall be adopted as a supplement. The active islanding detection comprises active frequency shift, reactive injection, harmonic injection, and the like.

As for islanding detection for multiple inverters operating in parallel, a common processing measure is to adopt same islanding detection method and synchronous injection method. That is, in a system where multiple inverters are connected in parallel, the same active islanding detection method is adopted for all inverters. Generally, to ensure synchronization of injection, a master controller shall be designed in the system. The master controller can be a separate controller; or the master controller may be a controller of one inverter with controllers of other inverters as slave. The connection between the master controller and the slave controllers is established through communication. During islanding detection, the master controller outputs a synchronous reference signal and transmits the synchronous reference signal to the respective slave controllers. After receiving the synchronous signal, the slave controllers execute the islanding detection action. To reduce communication delay, a high-speed communication bus, such as a CAN bus, is used. The premise of the processing measure is that each inverter adopts the same islanding detection mode, and high-speed (or real-time) communication needs to be established between inverters to realize accurate synchronization. If one inverter in the system adopts different mode or the inverters in the system are not synchronized, islanding detection of the system may be failed, resulting in poor robustness of the algorithm.

Further, if high-speed (or real-time) communication, or even communication, between the inverters in the system cannot be realized, for example, in a parallel system consisting of the photovoltaic energy storage inverter and an electric vehicle having bi-directional power interaction capability, the conventional islanding detection method in a parallel system is difficult to work in such application scenarios.

Therefore, it is quite necessary to develop an islanding detection system and method for multiple inverters operating in parallel without communication, thereby solving above technical problems.

SUMMARY OF THE INVENTION

In view of this, one object of the application is to provide an islanding detection system for multiple inverters operating in parallel. By adding a current detection circuit on a grid side or an AC side of the second inverter, it can perform distributed or centralized islanding detection for different situations adaptively, thereby improving the pass rate of islanding detection.

To realize the object, the application provides an islanding detection system for multiple inverters operating in parallel, the multiple inverters at least comprising a first inverter and a second inverter connected in parallel, wherein the islanding detection system comprises:

a current detection circuit arranged on a grid side or an AC side of the second inverter; and a controller connected to the current detection circuit and the first inverter, wherein the controller determines whether to perform a distributed islanding detection or a centralized islanding detection on the first inverter and the second inverter according to a grid voltage signal and a current detection signal of the current detection circuit.

The application further provides an islanding detection method for multiple inverters connected in parallel, the multiple inverters at least comprising a first inverter and a second inverter connected in parallel, wherein the islanding detection method comprises:

sampling a grid voltage to obtain a grid voltage signal;

sampling a current on a grid side or on an AC side of the second inverter to obtain a current detection signal; and determining whether to perform a distributed islanding detection or a centralized islanding detection on the first inverter and the second inverter according to the current detection signal and the grid voltage signal.

Hereinafter explanations are described in detail with reference to the embodiments, and further interpretations are provided to the technical solution of the application.

BRIEF DESCRIPTION OF THE DRAWINGS

To make the above and other objects, features, advantages, and embodiments of the application more apparent, the accompanying drawings are explained as follows.

DETAILED EMBODIMENTS OF THE INVENTION

Figure 1:
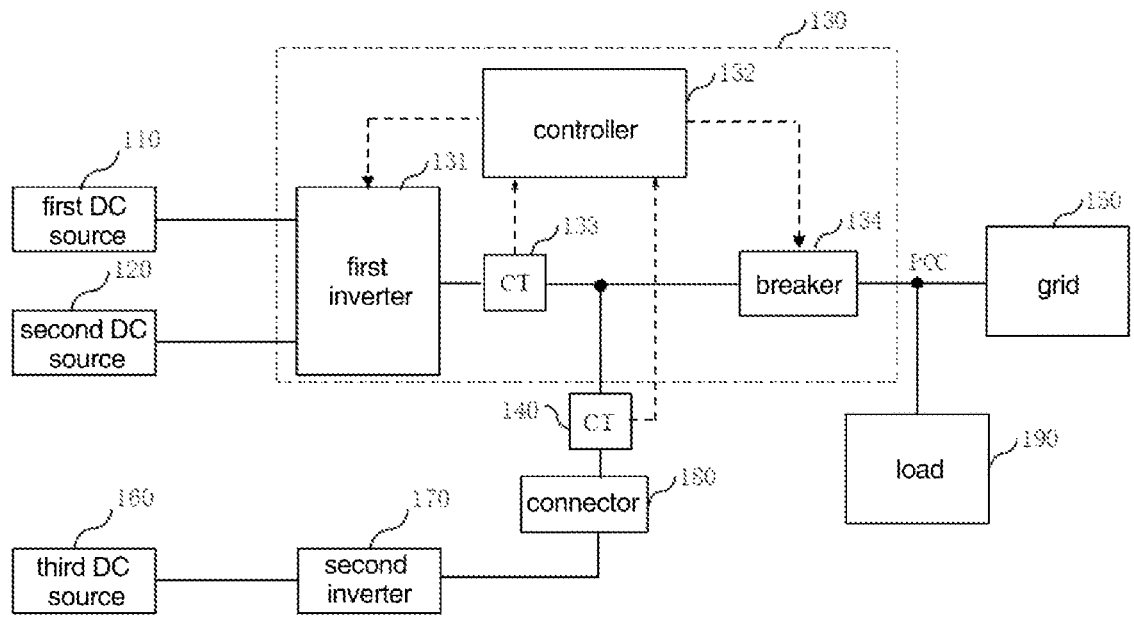
FIG. 1 is a circuit diagram of an islanding detection system for multiple inverters operating in parallel according to one embodiment of the application.

To make the description of the application more specific and complete, the accompanying drawings and various embodiments may be referred to, and the same numbers in the drawings represent the same or similar components. On the other hand, the commonly known components and steps are not described in the embodiments to avoid unnecessary limits to the application. Besides, for sake of simplifying the drawings, some known common structures and elements are simply illustrated in the drawings.

Figure 2:
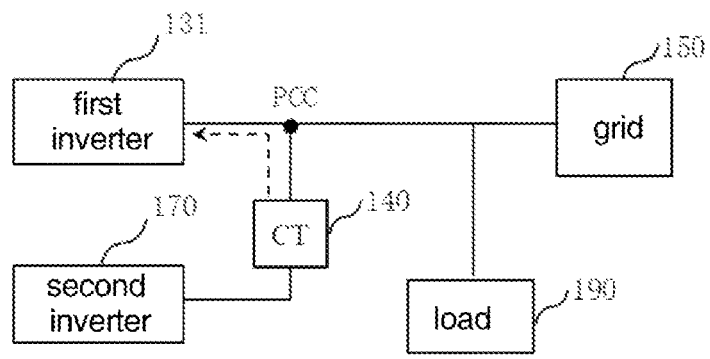
FIG. 2 is a simplified circuit diagram of an islanding detection system for multiple inverters operating in parallel according to another embodiment of the application.

According to one embodiment of the application, as shown in FIGS. 1-2, an islanding detection system for multiple inverters operating in parallel comprises at least a first inverter 131 and a second inverter 170 connected in parallel. The islanding detection system further comprises a current detection circuit 140 (which is referred to as a first current detection circuit) and a controller 132. The first current detection circuit 140 may be arranged on a grid side or an AC side of the second inverter 170. The controller 132 is connected to the first current detection circuit 140 and the first inverter 131, and determines whether to perform a distributed islanding detection or a centralized islanding detection on the first inverter 131 and the second inverter 170 according to a grid voltage signal obtained by sampling a grid voltage and a current detection signal detected by the first current detection circuit 140.

Specifically, FIG. 1 illustrates a circuit diagram of an islanding detection system for multiple inverters operating in parallel according to one embodiment of the application. The system may comprise: a first DC source 110, a second DC source 120, an inverter system 130, a local load 190, a grid 150, a third DC source 160, a second inverter 170, a first current detection circuit 140 and a connector 180. In some embodiments, the first DC source 110, for example, a photovoltaic panel, is connected to a first inverter 131. The second DC source 120, for example, a household energy storage battery, is connected to the first inverter 131. The inverter system 130, for example, is an energy storage inverter system. The third DC source 160, for example, an on-board battery, is connected to the second inverter 170. The second inverter 170 is an on-board charger, for example. The connector 180 may be a connector in form of a charging gun or the like.

Specifically, taking a Vehicle to Grid (V2G) system as an example, the system includes an electric vehicle, a photovoltaic panel, an energy storage battery, and an energy storage inverter. Correspondingly, in FIG. 1, the first DC source 110 is the photovoltaic panel, the second DC source 120 is the energy storage battery, the third DC source is power battery installed in the electric vehicle, the first inverter 131 is the energy storage inverter, the second inverter 170 is a bi-directional charger installed in the electric vehicle, and the connector 180 is a charging gun integrated into the energy storage inverter. The energy storage inverter is designed with an energy management system that can perform state monitoring and power control on the energy storage battery and the power battery in the electric vehicle. It shall be noted that the respective DC sources and the inverters may also be applied to other technical fields, but the application is not limited thereto.

The inverter system 130 may comprise a first inverter 131, a controller 132, a current detection circuit 133 (which is referred to as a second current detection circuit), and a breaker 134. The first inverter 131, the controller 132, the second current detection circuit 133, and the breaker 134 shown in FIG. 1 are discrete components, and in other embodiments, the controller 132, the second current detection circuit 133, and the breaker 134 may be integrated into the first inverter 131. It shall be noted that the inverter system 130 shall be provided with one second current detection circuit 133 in order to achieve control and islanding detection, which is arranged on an AC side of the first inverter 131. The second current detection circuit 133 is desired by the inverter system 130 itself and exists in current hardware, so explanations are omitted here. In actual application, in order to realize islanding detection when the multiple inverters are connected in parallel in the application, the first current detection circuit 140 shall be additionally provided in the system. In this embodiment, as shown in FIG. 1, the first current detection circuit 140 is arranged on an output side of the second inverter 170, for example, before and after the connector 180. In other embodiments, the first current detection circuit 140 is arranged on a common output side of the first inverter 131 and the second inverter 170, i.e., a grid side. The second current detection circuit 133 and the first current detection circuit 140 may be current sensors CT, and a current detection signal sampled by the current sensors CT is inputted into the controller 132. Further, the inverter system 130 comprises a voltage detection circuit (not shown) for sampling a grid voltage and inputting a grid voltage signal into the controller. The controller 132 completes recognition of islanding detection mode of the second inverter 170 and/or adjustment of islanding detection mode of the first inverter 131 itself through the processing of the sampled signals (e.g., the current detection signal and the grid voltage signal).

Further, the controller 132 is electrically connected to the first inverter 131 and transmits a control signal to the first inverter 131, thereby controlling the normal operational state of the first inverter 131, and realizing islanding detection and subsequent actions of the first inverter 131. The controller 132 controls the breaker 134 simultaneously, and after islanding is detected, the controller 132 controls the breaker 134 to disconnect the connection between the inverter system 130 and the load 190.

FIG. 2 illustrates a simplified circuit diagram of an islanding detection system for multiple inverters operating in parallel in FIG. 1 of the application. The first current detection circuit 140 is arranged at an output of the second inverter 170. In other embodiments, the first current detection circuit 140 may also be arranged on the grid side, with identical function and effect.

Figure 3:
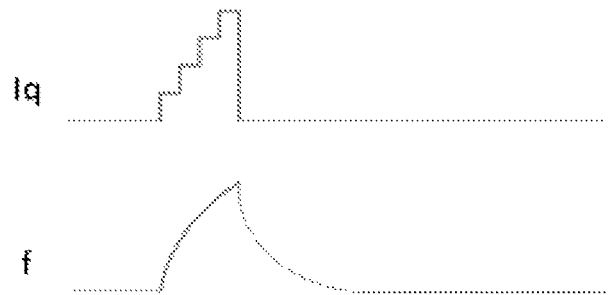
FIG. 3 is islanding detection mode based on reactive current injection according to one embodiment of the application.

FIG. 3 illustrates islanding detection mode based on reactive current injection according to one embodiment of the application. The functional mechanism of the islanding detection mode based on reactive current injection is as follows:

Step 1: injecting a reactive current Iq periodically on an output side of the inverter;

Step 2: calculating an output frequency according to a grid voltage signal, entering into an enhanced injection mode to increase the injection intensity of the reactive current when the output frequency changes, stopping injection and observing the output frequency after the injection intensity is increased to a certain value;

Step 3: recording one event when the output frequency observed in step 2 follows the frequency curve shown in FIG. 3; and Step 4: determining the occurrence of islanding when the event in FIG. 3 is detected several times continuously.

It shall be noted that in practice, the islanding detection mode includes but is not limited to the reactive current injection manner, and may also be other manners. Hereinafter the islanding detection when the multiple inverters operate in parallel is described by taking the reactive current injection as an example.

Figure 4:
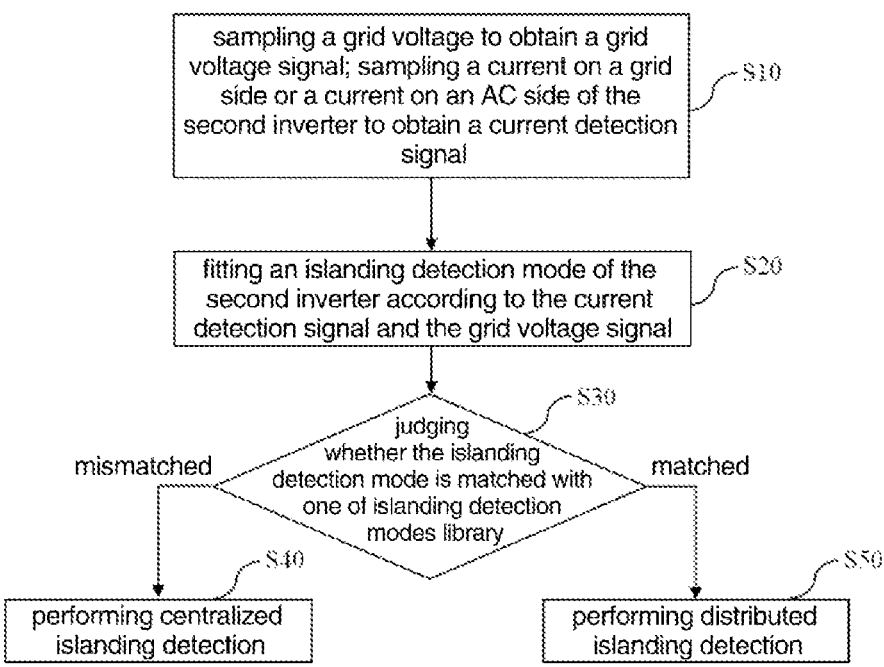
FIG. 4 is a flow diagram of an islanding detection method for multiple inverters operating in parallel according to one embodiment of the application.

FIG. 4 illustrates a flow diagram of an islanding detection method for multiple inverters operating in parallel according to one embodiment of the application. As shown in FIG. 4, the method mainly comprises:

Step S10: sampling a grid voltage to obtain a grid voltage signal, and sampling a current on a grid side or on an AC side of the second inverter to obtain a current detection signal;

Step S20: fitting islanding detection mode of the second inverter according to the current detection signal and the grid voltage signal; and Step S30: judging whether the islanding detection mode is matched with one of islanding detection modes library.

In some embodiments, the current detection signal sampled by the first current detection circuit 140 and the grid voltage signal sampled by a voltage detection circuit are inputted into the controller 132. The controller 132 fits the islanding detection mode of the second inverter 170 according to the current detection signal and the grid voltage signal. Specifically, the controller 132 may obtain electrical parameters including information of voltage, current, active power, reactive power, and frequency of the second inverter 170 according to the sampled signals. The controller 132 completes analysis and extraction of key features of the islanding detection mode of the second inverter 170, including disruption types (e.g., frequency shift, reactive injection, harmonic injection, etc.), disturbed period, disturbed amplitude, and the like, by obtaining mass electrical parameters of the second inverter 170. The controller 132 fits the islanding detection mode of the second inverter 170 according to the extracted features. Fitting of the islanding detection mode of the second inverter 170 may be based on mass sampled data (e.g., mass historical sampled data) including the current detection signal and the grid voltage signal sampled in the current period. As for fitting of the islanding detection mode of the second inverter 170, the fitting method in the prior art, or the method of machine learning may be adopted, but the application is not limited thereto.

In some embodiments, the controller 132 performs distributed islanding detection or centralized islanding detection accordingly according to judging whether the islanding detection mode is matched with one of the islanding detection modes library. The controller 132 is stored with a library including several typical islanding detection modes. The controller 132 compares the fitted islanding detection mode of the second inverter 170 with the mode in the library. If the fitted islanding detection mode overlaps with one mode with a certain ratio, the matching is successful, otherwise, the matching is failed.

Further, if the matching is failed, step S40 is performed; if the matching is successful, step S50 is performed.

Step S40: performing centralized islanding detection.

Step S50: performing distributed islanding detection.

If the islanding detection mode is matched with one of the islanding detection modes library, the distributed islanding detection is performed, wherein the first inverter 131 and the second inverter 170 connected in parallel each performs islanding detection separately.

If the islanding detection mode is not matched with one of the islanding detection modes library, the centralized islanding detection is performed, wherein the first inverter 131 and the second inverter 170 serve as an integral body and the centralized islanding detection is performed by the first inverter 131.

Specifically, in the centralized islanding detection, the controller 132 compensates a control signal for detecting an islanding operational state of the first inverter 131 in real time according to the current detection signal, i.e., compensates an islanding detection control signal of the first inverter 131 in real time, and outputs the compensated islanding detection control signal to the first inverter 131.

Figure 5:
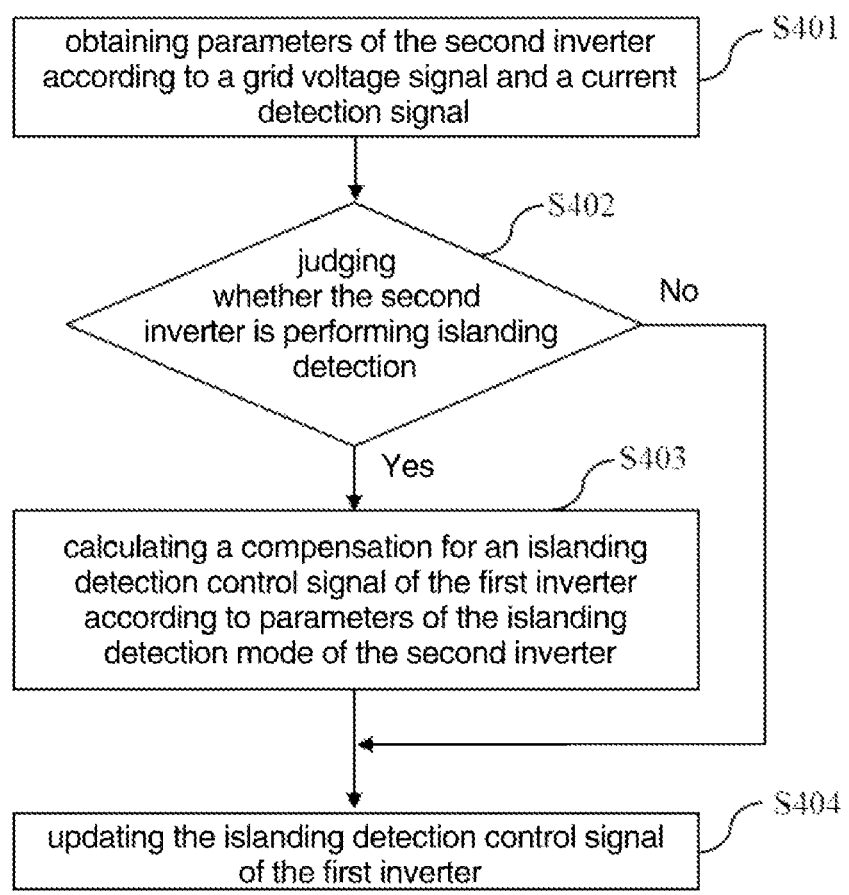
FIG. 5 is a flow diagram of centralized islanding detection according to one embodiment of the application.

FIG. 5 is a flow diagram of centralized islanding detection according to one embodiment of the application, comprising steps of:

Step S401: obtaining parameters of the second inverter according to a grid voltage signal and a current detection signal.

Exemplarily, the controller 132 may obtain parameters of the second inverter 170, including information of voltage, current, active power, reactive power, frequency, or harmonic wave according to the current detection signal and the grid voltage signal obtained by sampling.

Step S402: judging whether the second inverter performs islanding detection, if yes, performing step S403, otherwise, performing step S404;

Step S403: calculating compensation for an islanding detection control signal of the first inverter according to parameters of the islanding detection mode of the second inverter;

Step S404: updating the islanding detection control signal of the first inverter.

Taking the islanding detection method of reactive current injection as an example, assuming that when the influence of the second inverter 170 is not considered at one moment, the islanding detection control signal to be injected to the first inverter 131 is a reactive current 1 A, for example. Accordingly, a judging result of step S402 is "yes", i.e., the second inverter 170 is performing islanding detection. Meanwhile, for example, if it is calculated that the second inverter 170 is injected with a reactive current of 0.5 A according to the sampled signals, a compensation of an islanding detection control signal of the first inverter is calculated accordingly and its value is −0.5 A. The islanding detection control signal of the first inverter 131 is updated according to the compensation and its value is (1+(−0.5))=0.5 A. The first inverter 131 performs islanding detection according to the updated islanding detection control signal. Similarly, if it is calculated that the second inverter 170 is injected with a reactive current of −0.5 A, the value of the compensation of the islanding detection control signal of the first inverter is 0.5 A, and the updated islanding detection control signal of the first inverter is (1+(0.5))=1.5 A. Here specific explanations are made by taking the reactive current as an example, but the islanding detection control signal is not limited to the electrical parameters and may be an injected harmonic wave, for example. If a judging result of step S402 is "no", the first inverter may update the control signal according to its islanding detection mode.

Figure 6:
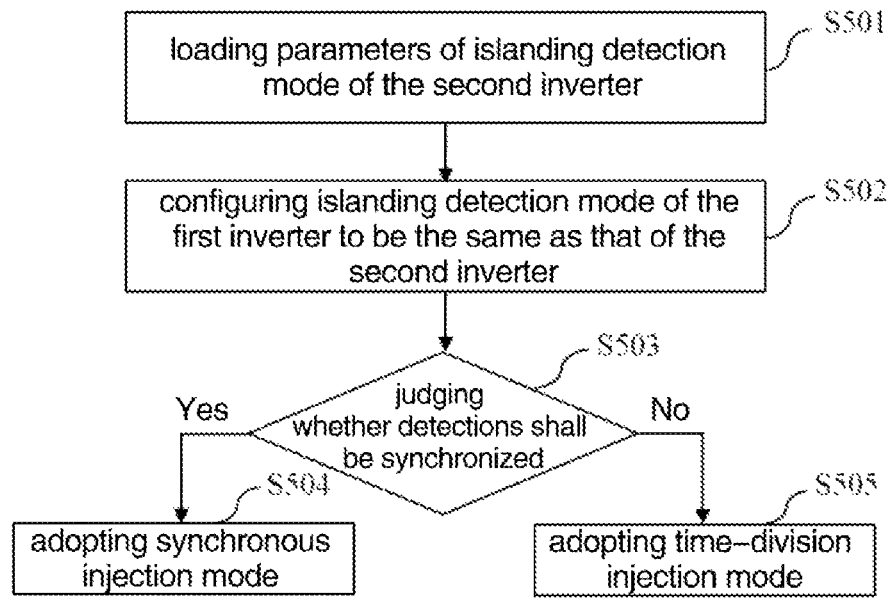
FIG. 6 is a flow diagram of distributed islanding detection according to one embodiment of the application.

FIG. 6 is a flow diagram of distributed islanding detection according to one embodiment of the application. As shown in FIG. 6, it comprises:

Step S501: loading parameters of islanding detection mode of the second inverter;

Step S502: configuring islanding detection mode of the first inverter to be the same as that of the second inverter;

Step S503: judging whether detection shall be synchronized;

If yes, step S504 is performed, and if no, step S505 is performed;

Step S504: adopting synchronous injection mode;

Step S505: adopting time-division injection mode.

Similarly, the controller 132 loads parameters of the islanding detection mode of the second inverter 170, including information of disruption types, injection period, injection amplitude, and the like.

Specifically, after the islanding detection mode of the second inverter 170 is obtained, the controller 132 configures the first inverter 131 to adopt the same islanding detection mode as the second inverter 170, and controls an islanding detection control signal of the first inverter 131 to be synchronous or asynchronous in timing with the second inverter 170.

Figure 7:
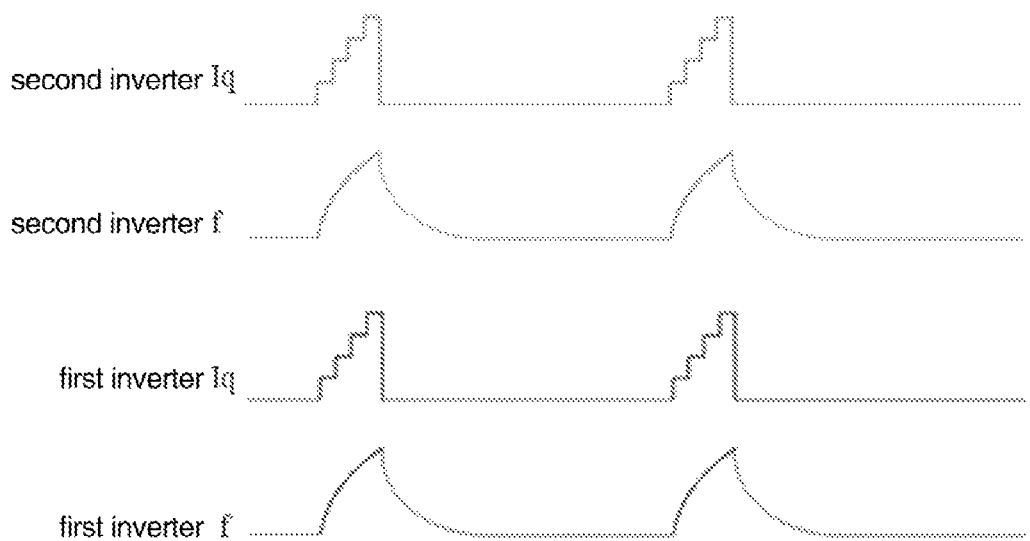
FIG. 7 is a schematic diagram of distributed islanding detection mode based on a synchronous injection mode according to one embodiment of the application.

FIG. 7 illustrates a schematic diagram of islanding detection modes of different inverters based on a synchronous injection mode. Taking reactive current injection as an example, referring to the fitted islanding detection mode of the second inverter 170 in FIG. 7, if an injected reactive current is shown by a second inverter Iq in FIG. 7 and a frequency change when islanding occurs is shown by a second inverter f in FIG. 7, the first inverter 131 is configured to load the same islanding detection mode as the second inverter 170 and injects a reactive current periodically. An injection time of reactive current of the first convert 131 is synchronous with that of the second inverter 170, and an injection amplitude of reactive current of the first convert 131 is consistent with that of the second inverter 170. An object of the design is to make injection signals of the two inverters form a superimposed effect and improve the speed of the islanding detection.

In some embodiments, when the time-division injection mode is adopted, the first inverter adopts the same islanding detection mode as the second inverter, but the islanding detection control signal of the first inverter is alternated strictly in timing with that of the second inverter, thereby ensuring no mutual effect of islanding detection there between.

Figure 8:
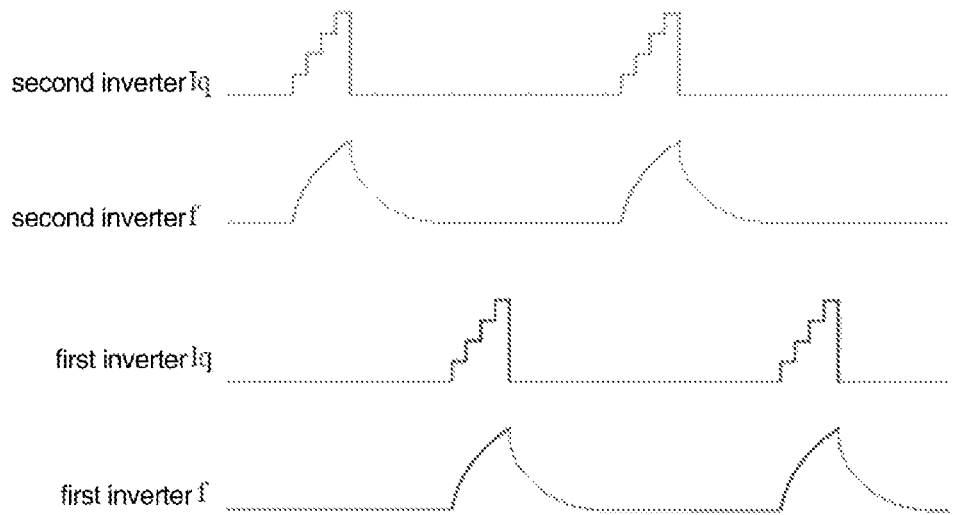
FIG. 8 is a schematic diagram of distributed islanding detection mode based on a time-division injection mode according to one embodiment of the application.

FIG. 8 illustrates a schematic diagram of islanding detection modes of different inverters based on a time-division injection mode. Taking reactive injection as an example, refer to an islanding detection mode of the second inverter 170 in FIG. 8, i.e., the injected reactive current is shown by a second inverter Iq in FIG. 8, and a frequency change when islanding occurs is shown by a second inverter f in FIG. 8. The first inverter 131 is configured to load the same islanding detection mode as the second inverter 170 by the controller 132 and injects the reactive current periodically. The injection action of the first convert 131 in each period is completed within an undisturbed interval of the second inverter 170. An object of the design is to make two converters perform independently islanding detection without interference with each other.

Figure 9:
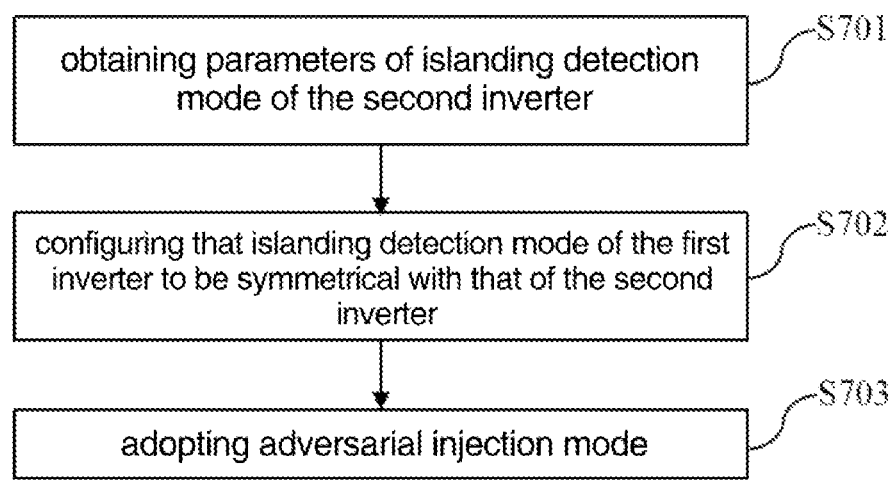
FIG. 9 is a flow diagram of distributed islanding detection according to another embodiment of the application.

In some other embodiments, an adversarial injection mode may be adopted. The specific flow diagram, as shown in FIG. 9, comprises:

Step S701: obtaining parameters of islanding detection mode of the second inverter;

Step S702: configuring the islanding detection mode of the first inverter to be symmetrical with that of the second inverter;

Step S703: adopting adversarial injection mode.

The first inverter 131 is configured to adopt an islanding detection mode which is symmetrical with the islanding detection mode of the second inverter to represent an adversarial relationship where one decreases while the other increases. Moreover, a detection period and time of the first inverter 131 are synchronous with those of the second inverter 170, such that a sum of the control signals of them is constant.

Figure 10:
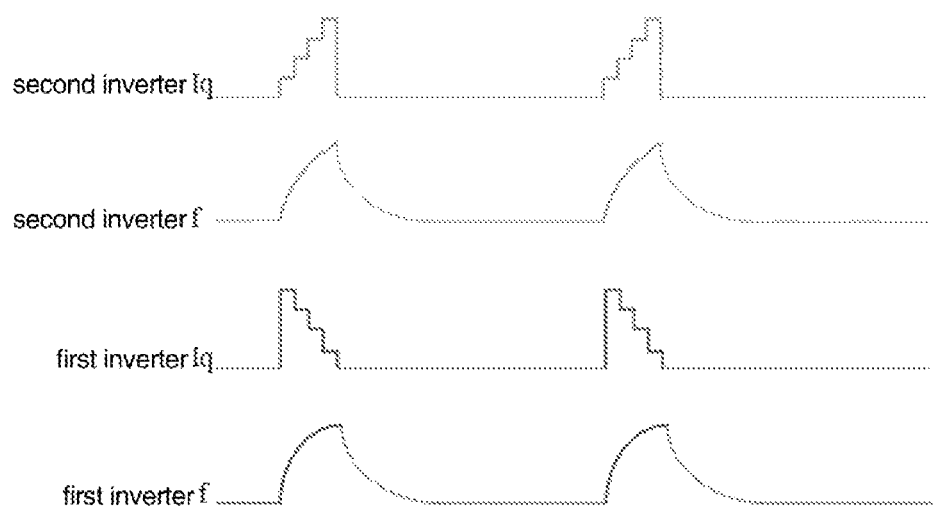
FIG. 10 is a schematic diagram of distributed islanding detection mode based on an adversarial injection mode according to one embodiment of the application.

Further, FIG. 10 illustrates a schematic diagram of islanding detection modes of different inverters in a synchronous injection mode. Taking reactive current injection as an example, referring to the fitted islanding detection mode of the second inverter 170 in FIG. 10, if an injected reactive current is shown by a second inverter Iq in FIG. 10 and a frequency change when islanding occurs is shown by a second inverter f in FIG. 10, the first inverter 131 is configured to load an islanding detection mode which is symmetrical to that of the second inverter 170 by the controller 132, and the first inverter 131 is also injected with the reactive current periodically. An injection time of the reactive current of the first converter 131 is synchronous with that of the second inverter 170, and an injection amplitude of the reactive current of the first converter 131 form an adversarial mode with that of the second inverter 170, to keep the total reactive current injection constant. That is, the injection amplitude of the reactive current of the first inverter 131 is configured to decrease as the injection amplitude of the reactive current of the second inverter 170 increases. An object of the design is to make injection signals of the two inverters form a superimposed effect and improve the speed of islanding detection, while the total reactive current injection may be controlled.

It can be understood that one injection mode of synchronous injection mode, time-division injection mode, and adversarial injection mode may be selected according to needs.

Preferably, in the distributed islanding detection, the controller 132 configures the islanding detection mode of the first inverter 131 to be the same as that of the second inverter 170, and the controller 132 applies an islanding detection control signal to the first inverter 131 in a synchronous injection mode or time-division injection mode relative to the second inverter 170, i.e., the controller 132 applies an islanding detection control signal corresponding to the islanding detection mode to the first inverter 131. Alternatively, the controller 132 configures the islanding detection mode of the first inverter 131 to be symmetrical with that of the second inverter 170, and the controller 132 applies an islanding detection control signal to the first inverter 131 in an adversarial injection mode relative to the second inverter 170, i.e., the controller 132 applies an islanding detection control signal corresponding to the islanding detection mode to the first inverter 131.

In the application, the controller recognizes the islanding detection mode of the second inverter, matches it with typical islanding detection mode preset in a library, and determines whether to perform a distributed or a centralized islanding detection according to the matching results, thereby improving a success rate of islanding detection.

Further, the islanding detection system for the multiple inverters operating in parallel connection of the application is simple in structure, and it is unnecessary to establish a complicated communication network in real time and matching is simple. The system of the application is suitable theoretically for any second inverter, and the second inverter does not have to make any change in design (including hardware and software).

Meanwhile, in the centralized islanding detection, the control signal for detecting an islanding operational state of the first inverter is compensated in real time, thereby reducing interference of islanding detection of the second inverter. In the distributed islanding detection, interference of islanding detection between different inverters is eliminated adopting the synchronous injection mode, time-division injection mode, or adversarial injection mode.

Although the application has been disclosed in the embodiments, the application is not limited thereto. Any skilled in the art shall make various variations and modifications without departing from the spirit and scope of the application, so the protection scope of the application shall be subjected to the scope defined by the appended claims.

What is claimed is:

1. An islanding detection system for multiple inverters operating in parallel, the multiple inverters at least comprising a first inverter and a second inverter connected in parallel, wherein the islanding detection system comprises:
    a current detection circuit arranged on a grid side or an AC side of the second inverter; and
    a controller connected to the current detection circuit and the first inverter,
    wherein the controller determines whether to perform a distributed islanding detection or a centralized islanding detection on the first inverter and the second inverter according to a grid voltage signal and a current detection signal of the current detection circuit.

2. The islanding detection system according to claim 1, wherein the controller determines an islanding detection mode of the second inverter according to the current detection signal and the grid voltage signal, and performs the distributed islanding detection or the centralized islanding detection according to whether the islanding detection mode is matched with one of islanding detection modes library.

3. The islanding detection system according to claim 2, wherein if the islanding detection mode is matched with one of the islanding detection modes library, the distributed islanding detection is performed, wherein the first inverter and the second inverter each performs islanding detection separately.

4. The islanding detection system according to claim 3, wherein in the distributed islanding detection, the controller configures the islanding detection mode of the first inverter to be the same as the islanding detection mode of the second inverter and applies an islanding detection control signal to the first inverter in a synchronous injection mode or time-division injection mode relative to the second inverter; or the controller configures the islanding detection mode of the first inverter to be symmetrical with the islanding detection mode of the second inverter and applies an islanding detection control signal to the first inverter in an adversarial injection mode relative to the second inverter.

5. The islanding detection system according to claim 2, wherein if the islanding detection mode is not matched with one of the islanding detection modes library, the centralized islanding detection is performed, wherein the first inverter and the second inverter serve as an integral body and the centralized islanding detection is performed by the first inverter.

6. The islanding detection system according to claim 5, wherein in the centralized islanding detection, the controller compensates an islanding detection control signal of the first inverter in real time according to the current detection signal and outputs the compensated islanding detection control signal to the first inverter.

7. The islanding detection system according to claim 1, wherein the controller controls a breaker to disconnect the multiple inverters from a load after an islanding operational state is detected.

8. The islanding detection system according to claim 1, wherein the controller and the current detection circuit are either arranged separately or integrated into the first inverter.

9. The islanding detection system according to claim 1, wherein a DC side of the first inverter is connected with a first DC source and a second DC source.

10. The islanding detection system according to claim 9, wherein the first DC source comprises a photovoltaic panel, the second DC source comprises a household energy storage battery, and the first inverter comprises an energy storage inverter.

11. The islanding detection system according to claim 1, wherein a DC side of the second inverter is connected with a third DC source.

12. The islanding detection system according to claim 11, wherein the third DC source comprises an on-board battery and the second inverter comprises an on-board charger.

13. An islanding detection method for multiple inverters connected in parallel, the multiple inverters at least comprising a first inverter and a second inverter connected in parallel, wherein the islanding detection method comprises:
    sampling a grid voltage to obtain a grid voltage signal;
    sampling a current on a grid side or on an AC side of the second inverter to obtain a current detection signal; and
    determining whether to perform a distributed islanding detection or a centralized islanding detection on the first inverter and the second inverter according to the current detection signal and the grid voltage signal.

14. The islanding detection method according to claim 13, wherein an islanding detection mode of the second inverter is determined according to the current detection signal and the grid voltage signal, and the distributed islanding detection or the centralized islanding detection is performed according to whether the islanding detection mode is matched with one of islanding detection modes library.

15. The islanding detection method according to claim 14, wherein if the islanding detection mode is matched with one of the islanding detection modes library, the distributed islanding detection is performed, in which the first inverter and the second inverter each performs islanding detection separately.

16. The islanding detection method according to claim 15, wherein in the distributed islanding detection, the first inverter adopts the same an islanding detection mode as the second inverter, and an islanding detection control signal is applied to the first inverter in a synchronous injection or time-division injection mode; or the first inverter adopts an islanding detection mode symmetrical to that of the second inverter, and an islanding detection control signal is applied to the first inverter in an adversarial injection mode.

17. The islanding detection method according to claim 14, wherein if the islanding detection mode is not matched with one of the islanding detection modes library, the centralized islanding detection is performed, wherein the first inverter and the second inverter serve as an integral body and the centralized islanding detection is performed by the first inverter.

18. The islanding detection method according to claim 17, wherein in the centralized islanding detection, an islanding detection control signal of the first inverter is compensated in real time according to the current detection signal, and the compensated control signal is outputted to the first inverter.

19. The islanding detection method according to claim 13, wherein after an islanding operational state is detected, a breaker is controlled to disconnect the multiple inverters from a load.

20. The islanding detection method according to claim 13, wherein a DC side of the first inverter is connected with a first DC source and a second DC source.

21. The islanding detection method according to claim 20, wherein the first DC source comprises a photovoltaic panel, the second DC source comprises a household energy storage battery, and the first inverter comprises an energy storage inverter.

22. The islanding detection method according to claim 13, wherein a DC side of the second inverter is connected with a third DC source.

23. The islanding detection method according to claim 22, wherein the third DC source comprises an on-board battery, and the second inverter comprises an on-board charger.

* * * * *